United States Patent
Koh et al.

(10) Patent No.: US 6,720,262 B2
(45) Date of Patent: Apr. 13, 2004

(54) METHOD OF FORMING COPPER INTERCONNECTIONS AND THIN FILMS USING CHEMICAL VAPOR DEPOSITION WITH CATALYST

(75) Inventors: Won Yong Koh, Taejon (KR); Hyung Sang Park, Seoul (KR); Ji Hwa Lee, Seoul (KR)

(73) Assignee: Genitech, Inc., Taejon (KR)

( * ) Notice: Subject to any disclaimer, the term of this patent is extended or adjusted under 35 U.S.C. 154(b) by 113 days.

(21) Appl. No.: 09/738,213

(22) Filed: Dec. 15, 2000

(65) Prior Publication Data

US 2001/0019891 A1 Sep. 6, 2001

(30) Foreign Application Priority Data

Dec. 15, 1999 (KR) .............................. 99-57939
Dec. 21, 1999 (KR) .............................. 99-59862
Dec. 23, 1999 (KR) .............................. 99-61129
Jan. 11, 2000 (KR) .......................... 2000-1232

(51) Int. Cl.$^7$ .............................................. H01L 21/44
(52) U.S. Cl. .................. 438/687; 438/597; 438/652
(58) Field of Search ................... 438/618, 687, 438/680, 681

(56) References Cited

U.S. PATENT DOCUMENTS

| 5,085,731 A | 2/1992 | Norman et al. |
| 5,087,485 A | 2/1992 | Cho |
| 5,098,731 A | 3/1992 | Feldpausch |
| 5,322,712 A | 6/1994 | Norman et al. |
| RE35,614 E * | 9/1997 | Norman et al. ............. 427/250 |
| 6,528,426 B1 * | 3/2003 | Olsen et al. ................ 438/689 |

FOREIGN PATENT DOCUMENTS

| WO | 0013207 | 3/2000 |
| WO | 0015866 | 3/2000 |

OTHER PUBLICATIONS

Potochnik, et al.; "Selective Copper Chemical Vapor Deposition Using Pd–Activated Organosilane Films"; *Langmuir*; vol. 11, No. 6, Jun. 6, 2001 (1995); pp. 1841–1845.

* cited by examiner

Primary Examiner—George Eckert
Assistant Examiner—N. Drew Richards
(74) Attorney, Agent, or Firm—Marger Johnson & McCollom, P.C.

(57) ABSTRACT

A method of forming copper conductors for interconnecting active and passive elements as well as signal and power lines for circuits and devices on silicon wafers is disclosed. The method disclosed herein involves with using catalysts in conjunction with a chemical vapor deposition(CVD) process with typically using copper as a source material for forming interconnecting conductors. Interconnecting method for filling trenches, via holes, contacts, large trenches and holes for power devices and lines as well as for forming large passive elements is also disclosed. Disclosed herein are also a method of filling narrow and deep trenches and small in diameter and deep holes, and a method of forming very thin film on the flat top surface so that an etchback process, such as wet or dry etchback as well as plasma etchback processes, can be used for removing a thin film in preparation for subsequent processing steps, thereby rather expensive chemical mechanical polishing(CMP) process need not be used.

12 Claims, 11 Drawing Sheets

METHOD OF FORMING COPPER INTERCONNECTIONS AND THIN FILMS USING CHEMICAL VAPOR DEPOSITION WITH CATALYST

BACKGROUND OF THE INVENTION

1. Field of the Invention

This invention relates to the methods of forming copper-based interconnections such as trenches, via holes, contacts and thin films in the submicron class of semiconductor technology areas by means of chemical vapor deposition (CVD) method using catalyst.

2. Description of the Related Art

Interconnecting active and passive elements as well as providing signal and power lines have been playing a vital role in the semiconductor-related product manufacturing processes.

Most widely used method is to use aluminum-based metals by means of deposition, etching, etc. because aluminum alloys are relatively easy to handle for processing, easy to obtain and inexpensive. However, aluminum alloys are known to be weak under high electrical as well as thermal stresses, causing a failure mechanism know as electromigration problem primarily due to the grain size.

Furthermore, as the device designrule becomes tighter, the grain size of aluminum alloys becomes more serious concern because of the aforementioned electromigration-related problems. Aluminum alloys are generally known as good conductors, thereby meeting the interconnection requirements including electrical performance requirements, such as RC time delays.

Recently, as the circuit density increases rapidly, high performance devices in terms of short time delays and better conductivity as well as robust physical characteristics of the interconnecting conductors with less electromigration problem is becoming increasingly desirable. As a result, better conductive materials, particularly, copper materials to replace aluminum alloys have been actively studied.

Since copper has high conductivity, it has advantages, among which copper is able to carry more currents while the electromigration-related problems are much less and also copper is very robust compared to aluminum. On the other hand, copper is significantly harder than aluminum, thereby it is difficult to etch compared to aluminum alloys, for which "deposit-and-then-etch" process can be readily applied. Therefore, in order to form an interconnecting conductor, for example, a damascene process is used, where a trench is formed on an insulating layer by means of etching and then the trench is filled with copper. Furthermore, in order to connect two conductors in two different layers, one on top of the other, via holes or contact holes are used. In this case, a dual damascene process, where the two steps of trenches and via holes or contact holes in two adjacent layers, one on top of the other, are filled with copper in one process step, may be used.

A widely used technology for filling trenches and holes is electroplating(EP) method. However, this process does not conform very well and also is not compatible well with the conventional semiconductor processing steps. Also, this process is rather complex and needs to be developed further in order to achieve high yield in a mass-production environment. For a good compatibility or conformity with conventional semiconductor device manufacturing processes, use of chemical vapor deposition(CVD) or physical vapor deposition(PVD) method such as sputtering technique is desirable. When sputtering technique is used to form interconnecting conductors using trenches and holes, a pinch-off phenomenon occurs near the top opening area of a deep trench or a deep hole. That is, the opening at the top is plugged up before the rest of the trench or the hole is filled. This is caused by the unique nature of "direct" deposition along the "line of sight" occurring generally during a PVD process. This is why the sputtering technique is not best suited yet for submicron class of semiconductor device manufacturing.

On the other hand, it is known that use of a chemical vapor deposition(CVD) method makes it possible to nucleate thin films and also to grow the thin films. It is also known that a CVD method provides a good step coverage, thereby the deposited film or a thin layer covers the flat parts(flat part at the top and bottom), the walls as well as the corners reasonably well. It has been reported, however, that when copper material is deposited by means of a CVD at about 200° C. of the substrate temperature, not only the film growth rate decreases below 50 nm/minute, which is considered as a slow rate, but also the film surface becomes bumpy, because the thin film after its nucleation starts growing like islands at the beginning of the growth.

In order to solve aforementioned problem of rather slow growth rate of a thin film and the bumpiness of the surface of the thin film when a CVD method is used for forming a thin film, a chemical deposition method using catalyst on the surface has been proposed and disclosed in the U.S. patent application Ser. No. 09/554,444 by Lee, where the proposed chemical vapor deposition method suggests use of iodine or bromine, which are members of halogen family of elements, as a catalyst in conjunction with a CVD. This method not only increases the growth rate of the copper film significantly, but also reduces the bumpiness of the resultant film surface.

The present invention proposes methods of forming copper interconnecting conductors such as trenches, via holes, contacts and thin films by means of chemical vapor deposition(CVD) method using catalysts as described in the following.

SUMMARY OF THE INVENTION

A method of forming copper interconnecting conductors by filling trenches, via holes and contacts without creating pinch-offs and voids by means of copper chemical vapor deposition(copper CVD) using catalyst is disclosed and presented. In a first aspect of the present invention, a method of using iodine or bromine as a catalyst in conjunction with a copper CVD method in filling trenches, via holes and contacts without creating undesirable pinch-offs and voids is disclosed and presented. This method fills the bottom part of the trenches and holes very fast without creating pinch-offs and voids, and the rate of deposition decreases as the trenches and holes are filled from bottom up, and copper is deposited at the slowest rate at the top surface. Unlike the conventional method such as a PVD method, the method of copper CVD using catalyst does not create pinch-offs at the top openings of trenches and holes.

In a second aspect of the invention, a method of forming a copper layer in narrow and deep trenches and small in diameter and deep holes by repeatedly applying the method described in the first aspect of the present invention is disclosed and presented. This method allows copper material deep into trenches and holes, thereby the deep trenches and holes can be filled with copper, while the conventional method such as sputtering technique would not allow such deep penetrations.

In a third aspect of the invention, a method of forming a very thin copper layer at the top surface is disclosed and presented, thereby the thin copper layer can be removed by etchback means, in preparation for the subsequent steps of processing, whereas this removal is typically carried out by rather expensive chemical mechanical polishing(CMP) method. Normally, conventional electroplating technique requires CMP method for removal of the copper at the top surface in preparation for the subsequent steps in processing.

BRIEF DESCRIPTIONS OF THE DRAWINGS

The present invention itself, as well as preferred modes and advantages thereof, will best be understood by reference to the following detailed description of embodiments when read in conjunction with the accompanying drawings, wherein.

DETAILED DESCRIPTION OF THE PRESENT INVENTION

In accordance with the present invention, a method of forming copper interconnecting conductors by means of copper chemical vapor deposition(CVD) process using catalysts for interconnecting active and passive elements as well as signal and power lines for circuits, devices and other elements on silicon wafers is disclosed and presented. More specifically, a method of filling trenches, via holes, contacts for interconnection is disclosed and presented. In accordance with other aspects of the present invention, a method of filling large trenches and holes for power devices and power lines as well as large passive elements is disclosed and presented herein. In accordance with yet another aspect of the present invention, a method of filling small depressions such as narrow and deep trenches and also deep via holes small in diameter by means of copper CVD using catalysts, where conventional methods such as electroplating process cannot be used for such small geometries is also disclosed. This method can also be used as a means of depositing a seed layer for electroplating the rest of the depressions later for economic reasons. Another aspect of the object of the present invention is to disclose and present a method of forming a very thin film layer on a flat top surface of the wafer purposefully in addition to forming copper interconnecting conductors, so that the thin film on the flat top surface can be removed by means of wet or dry etchbacks or high temperature plasma etchback processes in preparation of subsequent processing steps, thereby rather expensive chemical mechanical polishing(CMP) process need not be used.

According to the present invention, use of a copper CVD using catalysts makes it possible to deposit copper from bottom up and eventually, for example, a trench is filled up to the top opening without creating either a pinch-off at the top opening or a void or voids inside the trench. Furthermore, according to the present invention, the deposition rate is faster at the bottom of the trench, slower at the flat top between two trenches and on the side walls of a trench, which makes the copper CVD using catalyst an ideal processing for filling trenches, via holes and contacts with copper. Particularly, the deposition rate at the flat top surface is the slowest, but the copper CVD using catalyst is an excellent way of forming a thin copper film on a flat surface because the deposition rate is very fast in forming a thin layer of copper film compared to other conventional techniques. However, the deposition rate decreases rapidly as the film thickness builds up. In order to form a thicker layer, multiple steps of applying "apply catalyst-then-deposit copper" cycle may be needed, which is an aspect of the present invention disclosed herein.

Figure 1A:
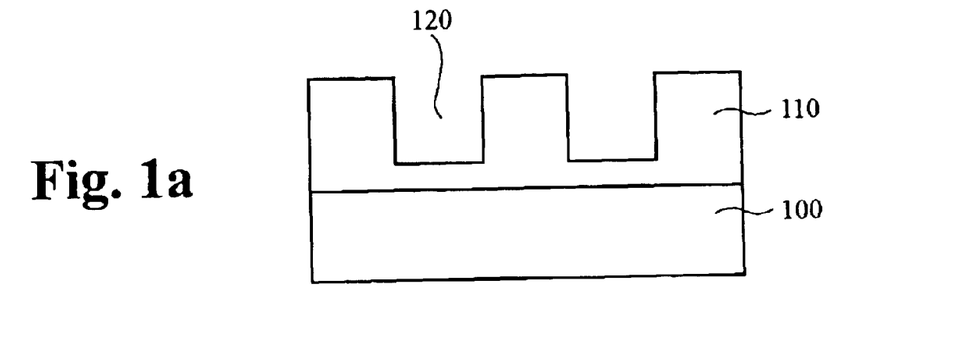
FIGS. 1a through 1d are a sequence of cross-sectional drawings illustrating the steps of forming trenches filled with copper material.
Figure 1B:
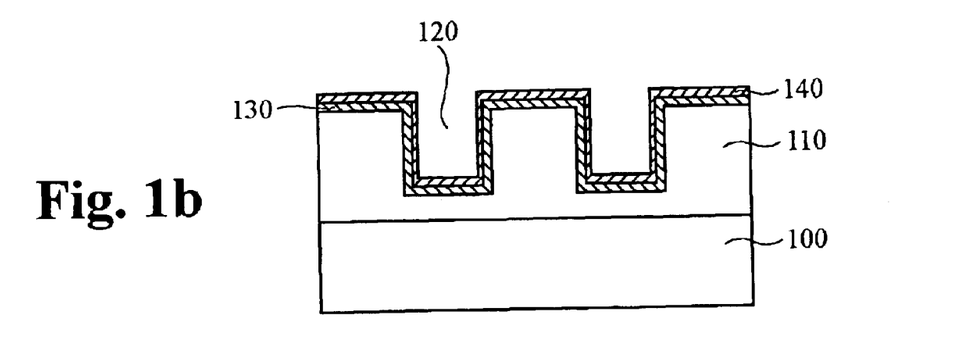
Figure 1C:
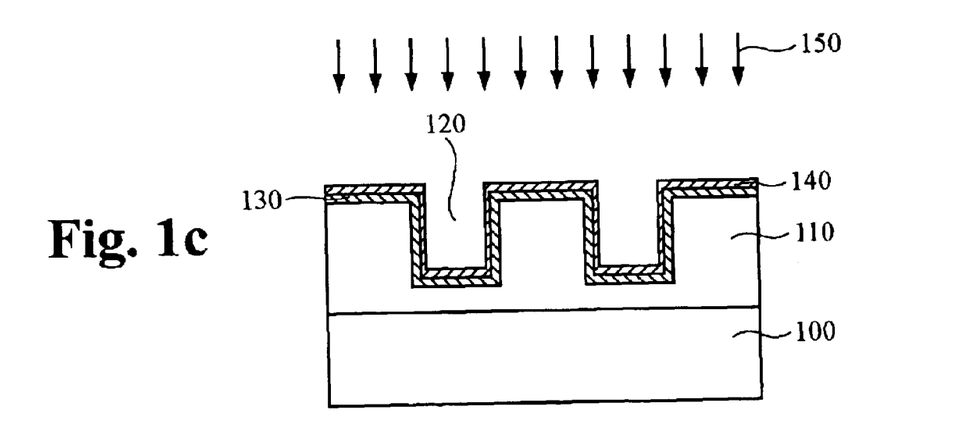

The reasoning behind the "bottom fills up first and fast" phenomena is twofold, referring to FIG. 1c. Firstly, catalyst acts as a good surfactant and the copper atoms move around very fast on the surface of the copper seed layer in FIG. 1c. As the copper layer builds up on the surface of the seed layer, the copper film grows in such a way that the growing surface area is minimized within the confined space inside a trench or a hole. Secondly, as the copper film grows, the surface area decreases, thereby the "density" of the catalyst increases. This in turn increases the copper growth rate, and the deposition rate becomes faster than outside a trench or a hole. The growth rate is fastest in general at the bottom of a trench or a hole because the rate of decrease in surface area is generally fastest at the bottom of a trench or a hole. For the same reason, the corners at the bottom of a trench or a hole are filled first. Here, as will become clearer in the preferred embodiments described hereafter, preferred catalysts are halogen family of elements, more specifically, iodine and bromine.

Figure 1D:
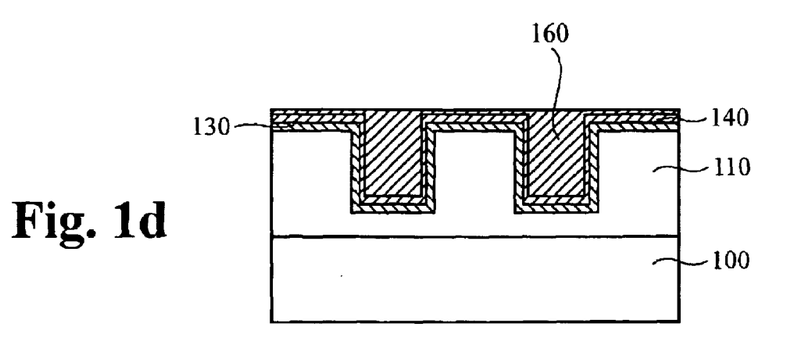

A copper CVD using catalyst according to the present invention is briefly described in the following. Referring to FIG. 1a, a trench 120 is formed in the insulating layer 110 on top of a substrate 100. In FIG. 1b, a barrier layer 130 that prevents conducting material from penetrating into the insulating layer 110 and the substrate 100 is formed on the top surface first, and then a copper seed layer 140 is formed on top of the barrier layer 130. Next step is to apply catalyst 150 as illustrated in FIG. 1c. Finally, copper material is deposited by means of copper CVD method as shown in FIG. 1d.

Figure 1E:
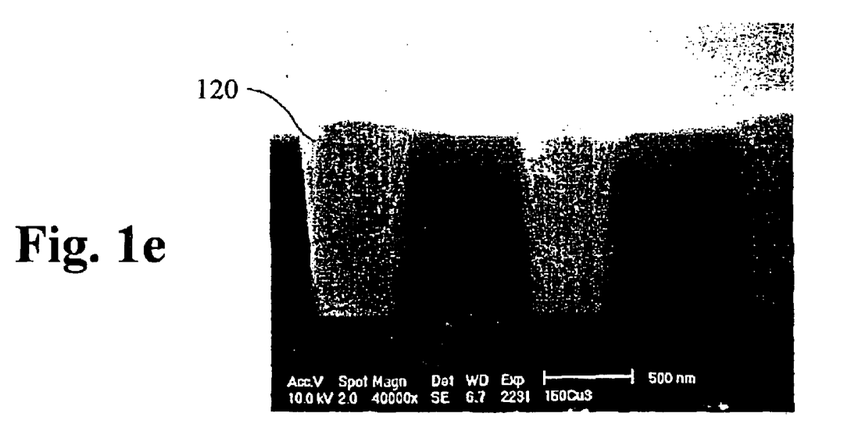
FIG. 1e is a scanning electron microscope(SEM) photograph showing a cross-sectional view of a row of via holes filled with copper.
Figure 1F:
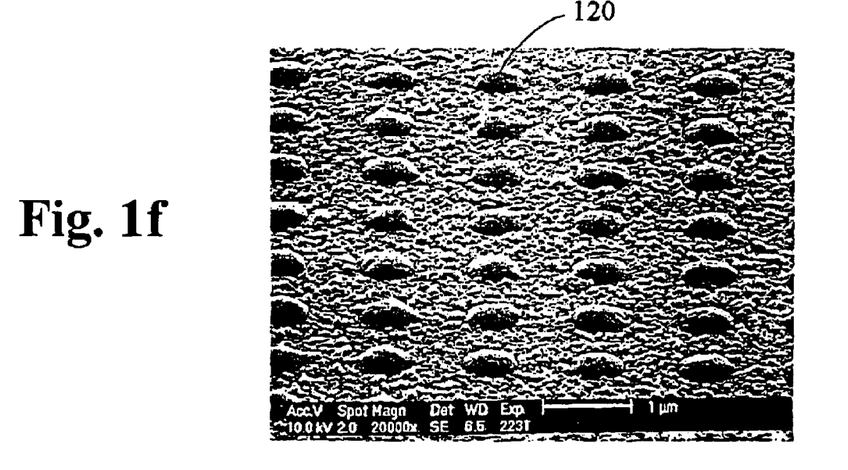
FIG. 1f is a scanning electron microscope(SEM) photograph showing a top view in an angle of an array of via holes filled with copper.
Figure 1G:
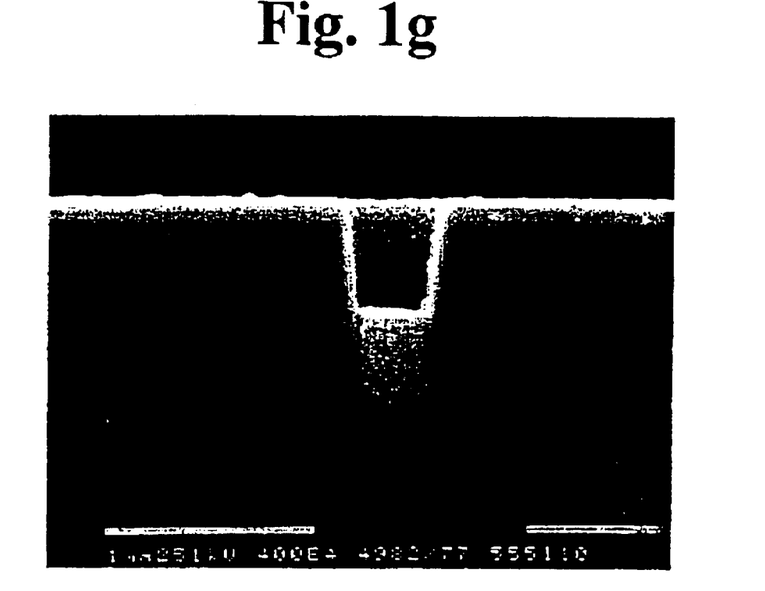
FIG. 1g is a scanning electron microscope(SEM) photograph showing a cross-sectional view of a via hole partially filled with copper to illustrate that copper fills the hole from bottom up.
Figure 1H:
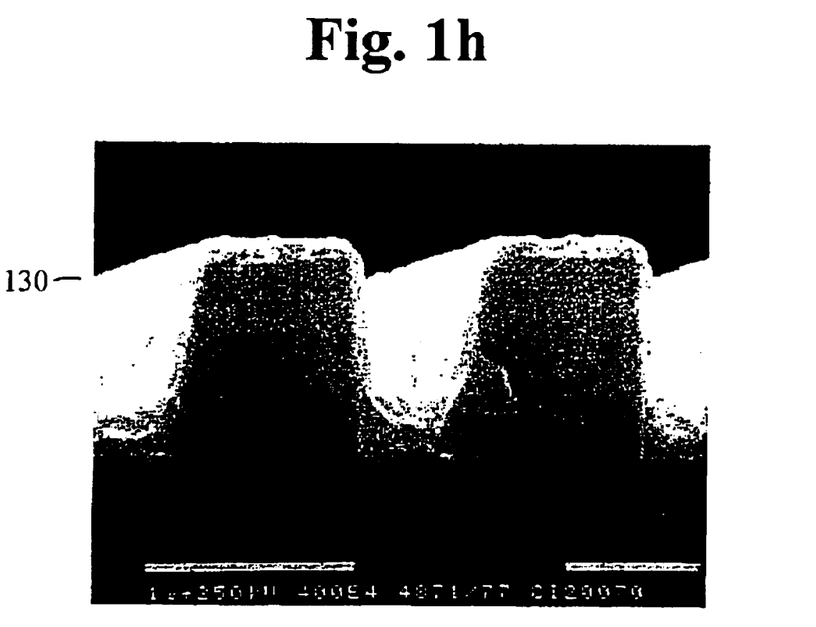
FIG. 1h is a scanning electron microscope(SEM) photograph showing a cross-sectional view of trenches partially filled with copper illustrating that the trenches are filled with copper from bottom up.

FIG. 1e is a scanning electron microscope(SEM) photograph showing a cross-sectional view of a row of via holes filled with copper. FIG. 1e shows that the copper layer at the top surface is very thin compared to the copper layer in the trench. FIG. 1f is a scanning electron microscope(SEM) photograph showing a top view in an angle of an array of via holes filled with copper. FIG. 1g is a scanning electron microscope(SEM) photograph showing a cross-sectional view of a via hole partially filled with copper to illustrate that copper fills up the hole from bottom up. FIG. 1h is a scanning electron microscope(SEM) photograph showing a cross-sectional view of trenches partially filled with copper illustrating that the trenches are filled with copper from bottom up.

There are advantages of using the copper CVD method using catalyst for forming interconnecting conductors in accordance with the present invention. First, the copper fill method according to the present invention is well suited for forming multiple layers of interconnecting conductors because the aforementioned method fills trenches, via holes and contacts without creating pinch-offs and voids. Second, the copper fill method aforementioned is a noble method because it fills trenches, via holes and contacts fast, but it slowly forms a thin layer of copper film on the flat surface at the top, thereby consuming small amount of expensive copper source material, which material must be polished off by means of, for example, chemical mechanical polishing (CMP) for processing subsequent steps. Third, the processing time for the CMP process described above is considerably shorter for the copper CVD method using catalyst because the thickness of the copper film at the top surface is very thin, thereby the aforementioned copper fill method is more economical compared to other conventional method such as electroplating.

The present invention will best be understood by reference to the following detailed exemplary and preferred embodiments. Some of the exemplary methods for forming interconnecting copper conductors by means of copper chemical vapor deposition(CVD) using catalysts for semiconductor manufacturing applications are disclosed and presented herein in accordance with the present invention. Those who are knowledgeable in the art should be able to easily perform other means of forming interconnecting conductors as desired within the spirit of the present invention. Therefore, the scope of the methods in accordance with the present invention is not limited to the preferred embodiments presented here.

Preferred Embodiment 1

A method of forming interconnecting conductors such as trenches, via holes, contacts using copper material by means of a copper chemical vapor deposition(CVD) process using catalyst is disclosed and described below in detail.

First step is preparation of samples. FIG. 1a shows a damascene structure by etching a hole 120 in an insulating layer 110 or the silicon substrate 100. This is a typical damascene structure. The top opening of a hole 120 is 500 nm in width and the aspect ratio is 2:1, (therefore, the depth of the hole 120 is 1000 nm). Referring to FIG. 1b, all surfaces including the hole 120 are covered with tantalum nitride(TaN) film 130 by means of sputtering. This tantalum nitride film acts as a barrier layer that prevents the conducting material 140 from penetrating into the insulating layer 110 during deposition process, where such penetration would, otherwise, alter the basic integrity of the conductor-insulator relationship, thereby defeating the purpose of forming interconnecting conductors. Other materials suitable for barrier layers are Ta, Ti, TiN, Ta—Si—N and Ti—Si—N. Some of the materials for insulating layers are known to resist to the penetration by copper material, thereby such insulating material acts as a barrier layer against copper. On top of the barrier layer 130 in reference to FIG. 1b, a copper seed layer 140 is deposited by means of sputtering. The thickness of a seed layer is 30 nm measured at the top surface of the insulating layer 110, and the thickness of a seed layer is about 3 nm measured at the inside wall of a hole. The best mode figure is found to be about 30 nm measured at the top surface of the insulating layer 110.

In reference to FIG. 1c, the sample prepared as described above is treated with ethyl iodide as a catalyst 150 using a custom designed reaction chamber in 5 Torr level of vacuum. Subsequently, the silicon substrate sample is treated for about 3 minutes with a copper source material (hfac)Cu(vtms), where the ligand (hfac) means (hexafluoroacetylacetonate) and the ligand (vtms) means (Vinyltrimethylsilane), at 180° C. and under 0.7 Torr of partial pressure of the copper source material (hfac)Cu(vtms) out of the total pressure of 5 Torr with argon carrier gas, to fill the holes with copper 160 as shown in FIG. 1d, resulting in the scanning electron microscope(SEM) photographs shown in FIGS. 1e through 1h.

FIG. 1e is a cross-sectional view of holes showing that they are filled uniformly without pinch-offs and voids. FIG. 1f shows a top view of holes illustrating that the holes are filled completely. FIG. 1g is an SEM photograph taken in the beginning of the fill process, indicating that the fill process starts from the bottom of the hole and fills the hole upward. FIG. 1h is an SEM photograph showing that the copper fills the trenches also from the bottom and upward.

As FIGS. 1g and 1h indicate, a copper layer grows fast at the bottom of trenches and holes, and then grows upward without creating pinch-offs and voids inside and at the top of the trenches and holes. It has been observed that even when the copper layer grows as thick as 100 nm outside the trenches and the holes, neither pinch-offs nor voids have been created at the top or inside the trenches and holes.

Preferred Embodiment 2

Interconnecting conductors imbedded into silicon substrates have many different shapes and sizes. The interconnecting conductors for power and signal applications are generally larger. However, as described in Preferred Embodiment 1 above, the copper fill method based on a copper CVD using catalyst according to the present invention is not well suited for filling a large area where the aspect ratio is very small such as a pad for input/output(I/O) signal and power lines.

Since damascene structures must be used in conjunction with copper deposition method according to the present invention because of the difficulty in etching copper materials unlike other "soft" metals such as aluminum alloys, a large trench with very small aspect ratio must be formed in order to use the copper fill method in accordance with the present invention.

Figure 1I:
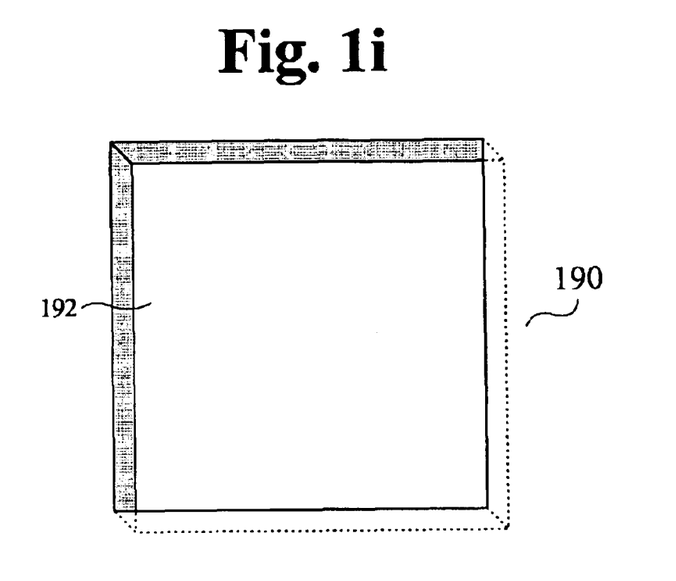
FIG. 1i is a drawing illustrating a large etched area ready for copper fill.
Figure 1J:
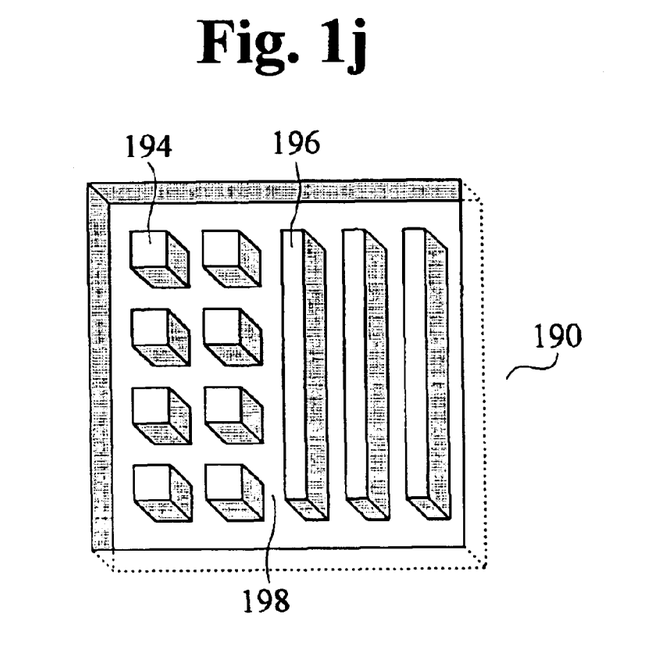
FIG. 1j is a drawing showing a large etched area with an illustrative pattern of walls and columns for better copper fill.

Referring to FIG. 1i, a large trench 192 is formed in an insulating layer 190. However, a copper fill method in accordance with the present invention is not well suited to fill the large area of such over-sized trench. The pattern shown in FIG. 1j is an illustrative example of utilizing the copper fill method described in Preferred Embodiment 1 above in order to form a conductive "pad" by using the copper fill method in accordance with the present invention, whereas many narrow trenches are needed in order to form a contiguously connected conductive layer. An over-fill above the entire trench area provides a good conductive "pad". Referring to FIG. 1j, inside the entire trench area 190, there are many columns 194 and walls 196, thereby providing many narrow trenches 198. Such structure is better suitable for utilizing the copper fill method in accordance with the present invention as described in Preferred Embodiment 1 above, to form a conductive "pad" for signal Input/Output(I/O) terminals and power lines.

Preferred Embodiment 3

Figure 2A:
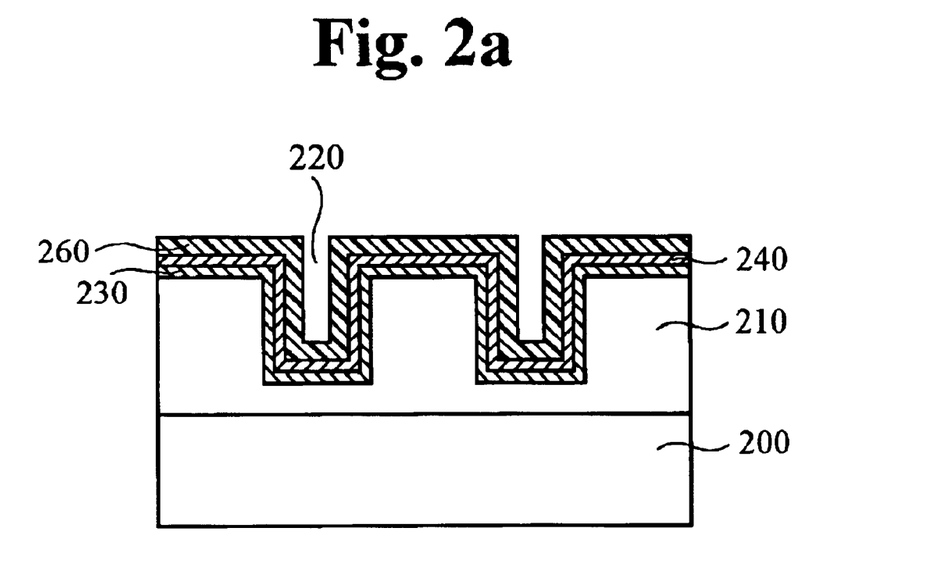
FIG. 2a is an illustrative cross-sectional drawing showing a second copper layer thick enough for the conventional electroplating to fill the trenches and holes completely.

As afore-described in Preferred Embodiment 1, a silicon substrate sample with a barrier layer 230 and a seed layer 240 inside a trench 220 as well as on the top surface referring to FIG. 2a is prepared. In general, a sputtering method is used in forming barrier layer 230 as well as a seed layer 240. However, when the top opening of trenches and via holes are narrow, a CVD method may be used for forming a barrier layer 230 using TaN, or TiN and also a copper CVD method using ethyl-iodide as catalyst may be used for forming a seed layers 240. The copper source material (hfac)Cu(vtms) is again used here the same way as in Preferred Embodiment 1.

Figure 2B:
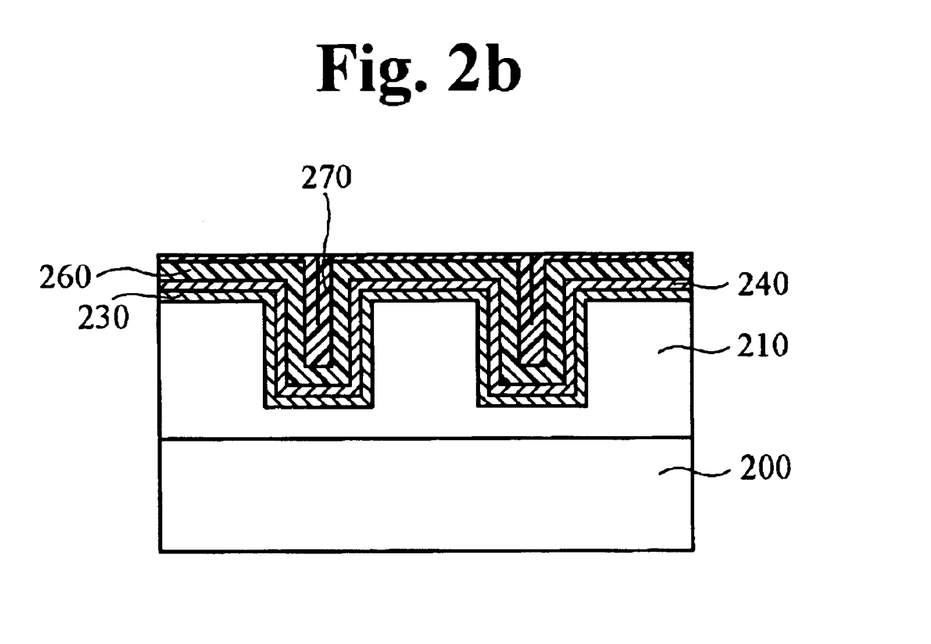
FIG. 2b is an illustrative cross-sectional drawing showing completely filled trenches with copper.

The catalyst ethyl-iodide is also applied as shown in FIG. 1c to form an additional copper layer 260 by means of a copper CVD using catalyst, whereby the second copper layer 260 is made thick enough (no more than 100 nm) to be used as an electrode for electroplating on top of the copper layer 260. Completely-filled copper layer 270 by means of electroplating is shown in FIG. 2b.

This exemplary embodiment is an economical way of filling rather large trench, via hole and contact, because the copper source material used for the copper CVD using catalyst is much more expensive than the copper source material used for electroplating.

Preferred Embodiment 4

Figure 3A:
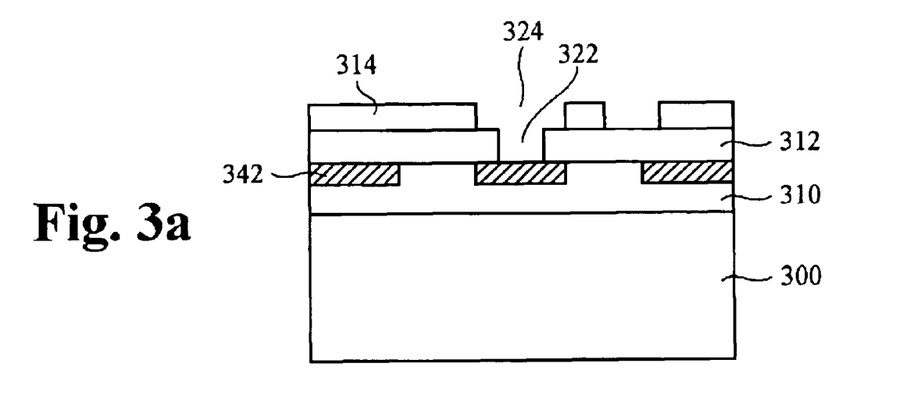
FIGS. 3a through 3c are a sequence of copper fill processes for a dual damascene trench-and-via-hole structure.

In general, it is difficult to use an electroplating technique for a dual damascene structure because the depth of a trench stacked with a via hole as illustrated in FIG. 3a as a stacked trench 324 is deep. The copper fill method using catalyst in accordance with the present invention is a better suited method in such situations with dual damascene structures.

Figure 3B:
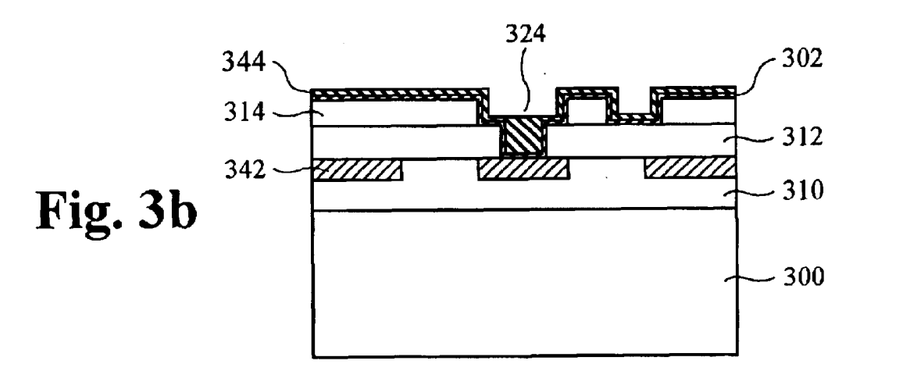
Figure 3C:
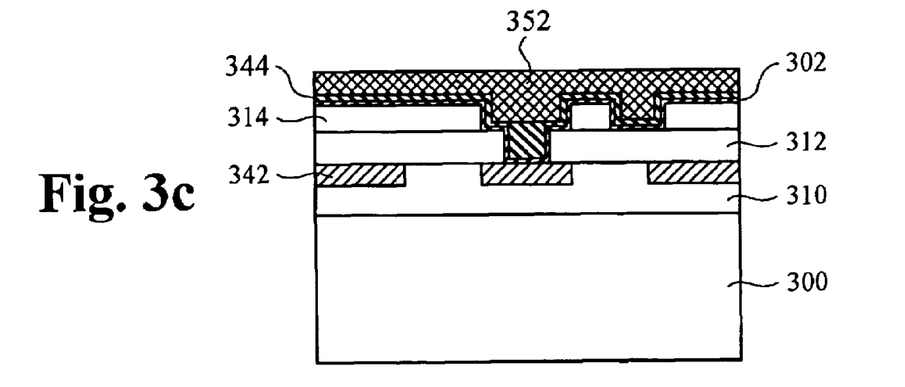
Figure 4A:
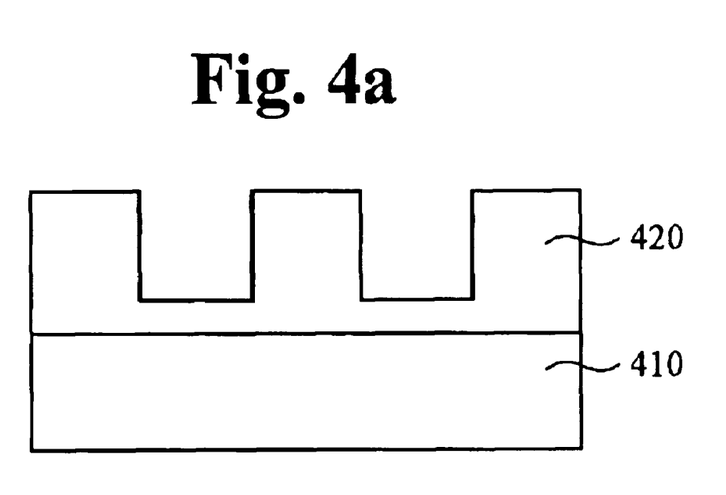
FIG. 4 is a cross-sectional drawing for illustrating a formation of a thin film with copper.
Figure 4B:
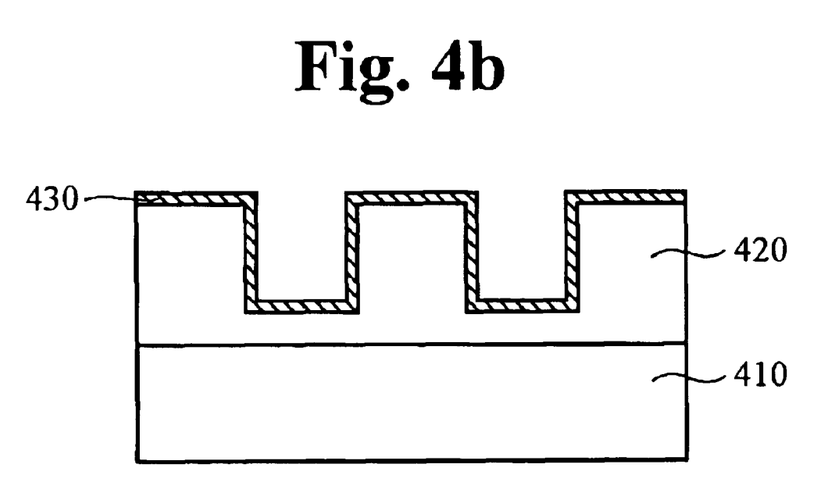
Figure 4C:
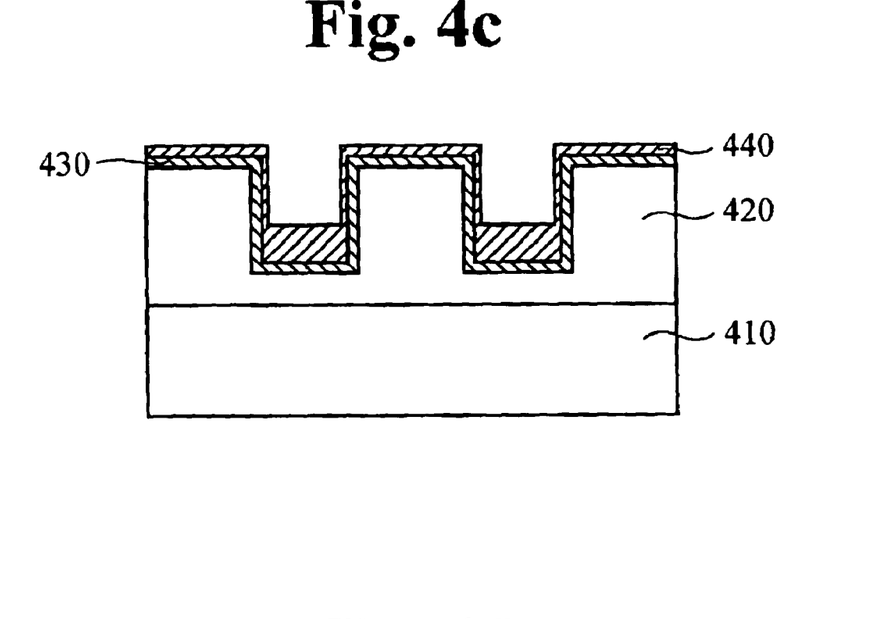
Figure 4D:
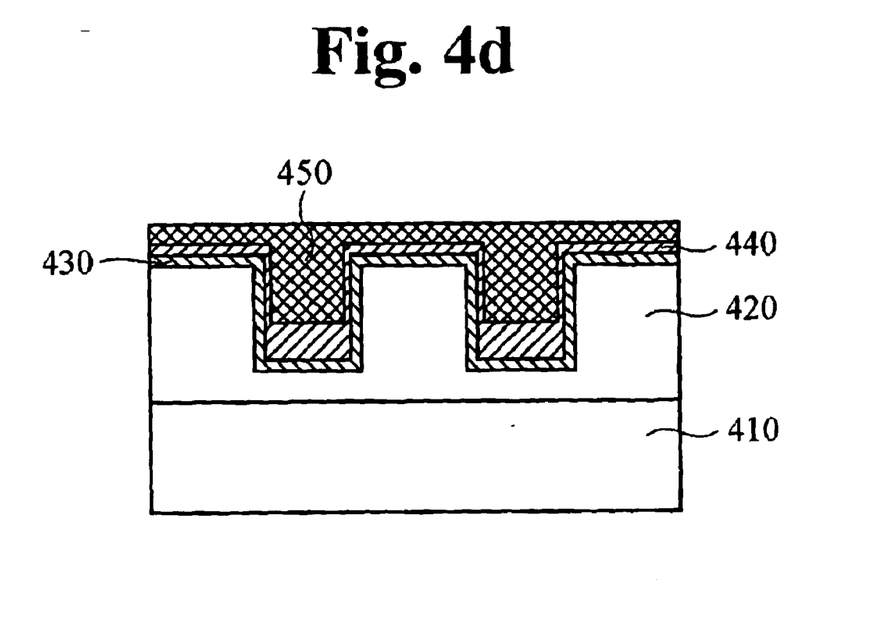

Referring to FIG. 3a, a conducting layer 342 is patterned on a first insulating layer 310 on top of a substrate 300. After a planarization process of the first insulating layer 310 with conductor pattern 342 by means of a conventional method, a second insulating layer 312 is deposited on top of the first insulating layer 310 and a contact hole 322 is etched in the second insulating layer 312. After forming a third layer 314, a trench 324 is etched. As a result, a dual damascene structure, which comprises a trench 324 and a contact hole 322, is formed. Next, in reference to FIG. 3b in order to fill a contact hole 322 and a trench 324, a copper seed layer 344 is formed using a copper CVD method using ethyl-iodide as a catalyst after covering the entire surface with a barrier layer 302 that prevents the conducting material from penetrating into the insulating layer during subsequent processing steps. During growth period of the seed layer 344, the contact hole 322 is filled with copper as shown in FIG. 3b. In general, holes are filled with copper much faster than trenches, thereby an electroplating technique can be used for filling the unfilled trenches while the holes have already been filled by means of a copper CVD method using catalyst. Subsequently, the trench 324 is filled by means of electroplating as a copper layer 352 as illustrated in FIG. 3c. The copper seed layer 344 must be thick enough (preferably, no thicker than 100 nm) so that the copper seed layer 344 may be used as an electrode for electroplating.

In accordance with the present invention, trenches, via holes and contacts can be filled with copper without creating pinch-offs and voids.

Preferred Embodiment 5

As the circuit density increases, the design-rule becomes tighter and tighter, thereby the top opening of trenches and holes becomes narrower and smaller. In such case, catalyst may not penetrate into the deep bottom easily and conventional sputtering method may not be suitable for forming a copper seed layer, and therefore, a repeated application of "apply catalyst-and-the-deposit copper" process cycle may be necessary. This embodiment addresses a remedy for such case.

Referring to FIG. 4, after forming trenches or holes in an insulating layer 420 on a silicon substrate 410 as described in Preferred Embodiment 1, a barrier layer 430 using titanium nitride (TiN) or tantalum nitride (TaN) is formed. To form a copper seed layer 440, "apply catalyst-and-then-deposit copper" process cycle is repeated at least twice in sequence until the thickness of the copper seed layer reaches a thickness not exceeding 70 nm measured at the flat top surface. Subsequently, the copper seed layer formed by means of the method described above may be used as an electrode for electroplating to form a second copper layer 450.

In accordance with the present invention, pinch-off free and void free copper layer 450 can be obtained through electroplating method by using the first copper seed layer 440 as an electrode.

Finally, the flat top surface of the conductor in FIG. 4 must be removed in order to proceed to the next step of processing for forming copper interconnecting conductors.

Preferred Embodiment 6

In accordance with the present invention, a method of forming interconnecting conductors by means of copper CVD using catalyst has several advantages as described earlier. First, the copper layer growth rate is the fastest at the bottom of a narrow and deep structure such as trenches, via holes and contacts. As a copper layer grows further, the growth rate decreases rapidly, and at the top surface, the rate of growth becomes slowest in general. As a result, referring to FIG. 5a, a trench 520, as an example, is filled with copper rapidly, but on a top surface, a copper layer 554 generally grows slowest, resulting in a thin copper layer 554. As a subsequent processing step, in order to form good interconnecting conductors, conducting layers 530, 540 and 554 must be removed, so that the next layer of conductors can be built up.

Figure 5A:
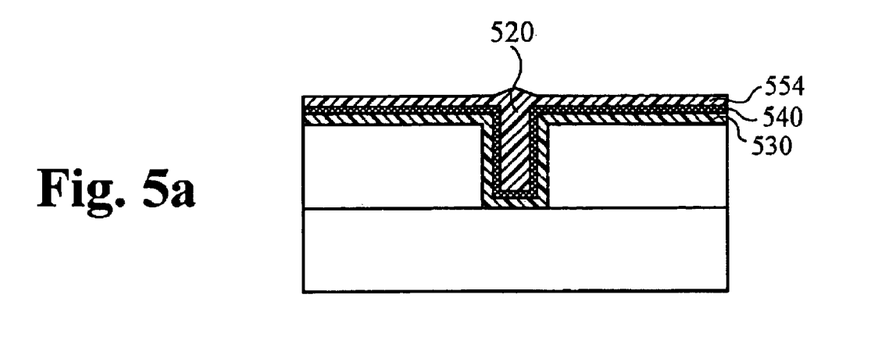
FIG. 5a is a cross-sectional drawing filled with copper similar to FIG. 1d but with a slight over-fill.
Figure 5B:
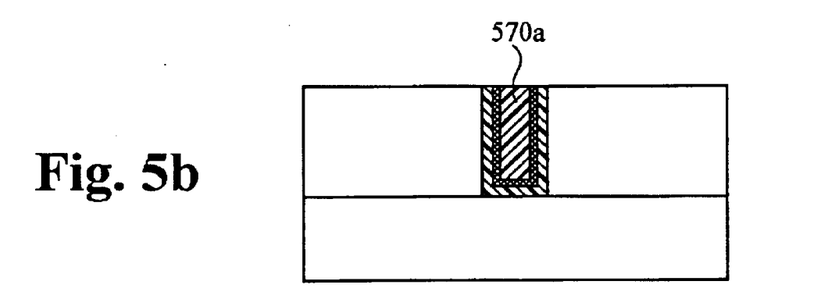
FIG. 5b is a cross-sectional drawing showing a result of removal of the surface layer of FIG. 5a by using chemical mechanical polishing(CMP) method to form an interconnecting conductor in a trench.

FIG. 5b is an exemplary method of eliminating and planarizing the top conductive layers 530, 540 and 554 in FIG. 5a by means of conventional chemical mechanical polishing(CMP) process in accordance with the present invention.

Preferred Embodiment 7

Figure 5C:
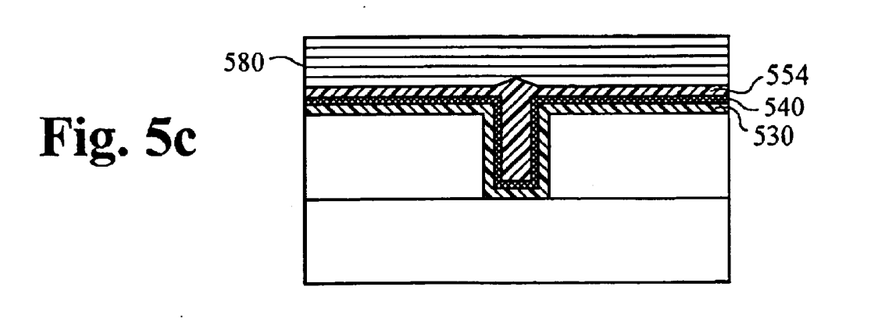
FIG. 5c is a cross-sectional drawing of FIG. 5a showing chemical etchant on top.
Figure 5D:
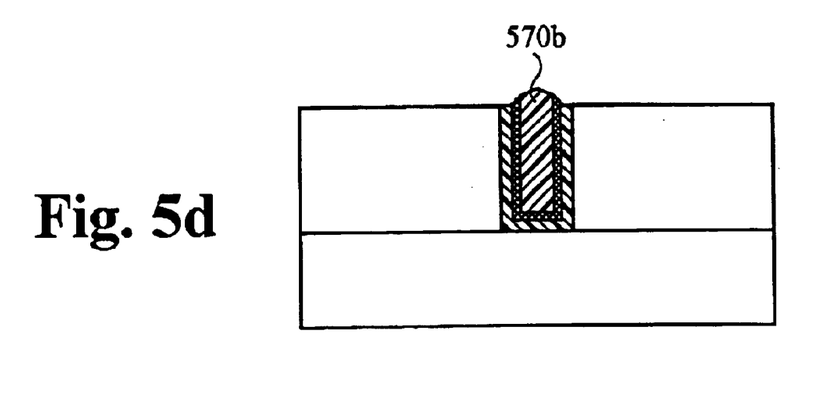
FIG. 5d is a cross-sectional drawing of FIG. 5c after the top layer is etched in order to form a trench interconnecting conductor.

This is another exemplary method of eliminating and planarizing the top conductive layers 530, 540 and 554 in FIG. 5a by means of chemical etching according to the present invention. Referring to FIG. 5c, a chemical etching agent 580 is applied to the entire surface of the copper layer 560, resulting in a flat surface without conductive layers as shown in FIG. 5d. This is possible because the conductive layers 530, 540 and 554 in FIG. 5a are very thin in accordance with the present invention.

Preferred Embodiment 8

Figure 5E:
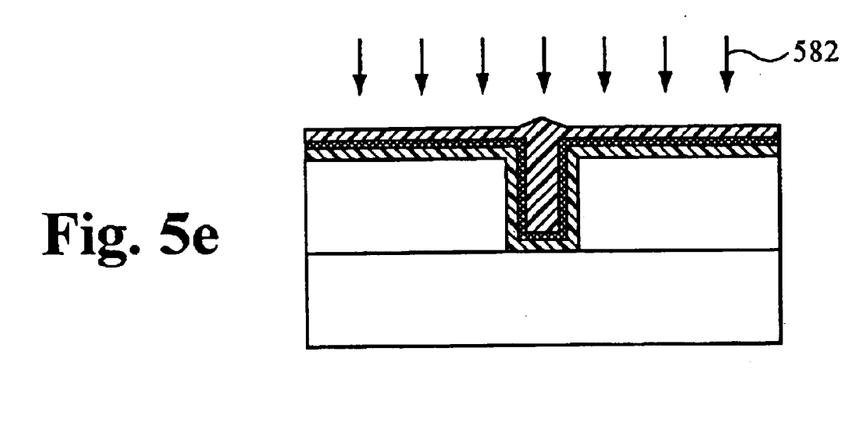
FIG. 5e is a cross-sectional drawing of FIG. 5a showing a plasma etching process.
Figure 5F:
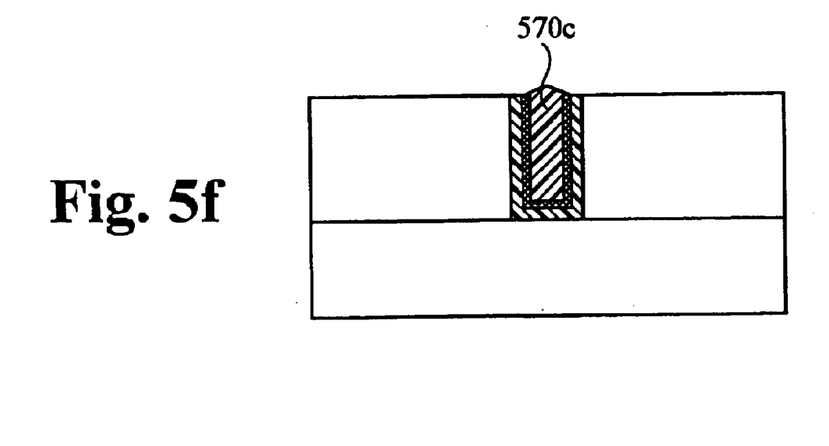
FIG. 5f is a cross-sectional drawing of FIG. 5e after the top copper layer has been plasma-etched in order to form an interconnecting conductor in a trench.

This is yet another exemplary method of eliminating and planarizing the top conductive layers 530, 540 and 554 in FIG. 5a by means of high temperature plasma etching according to the present invention. Referring to FIG. 5e, a high temperature plasma etching 582 is applied to the entire surface in order to remove the conductive layers 530, 540 and 554 on the surface in FIG. 5a, resulting in a flat surface as shown in FIG. 5f. This is possible because the conductive layers 530, 540 and 554 in FIG. 5a are formed very thin according to the present invention.

Preferred Embodiment 9

Figure 5G:
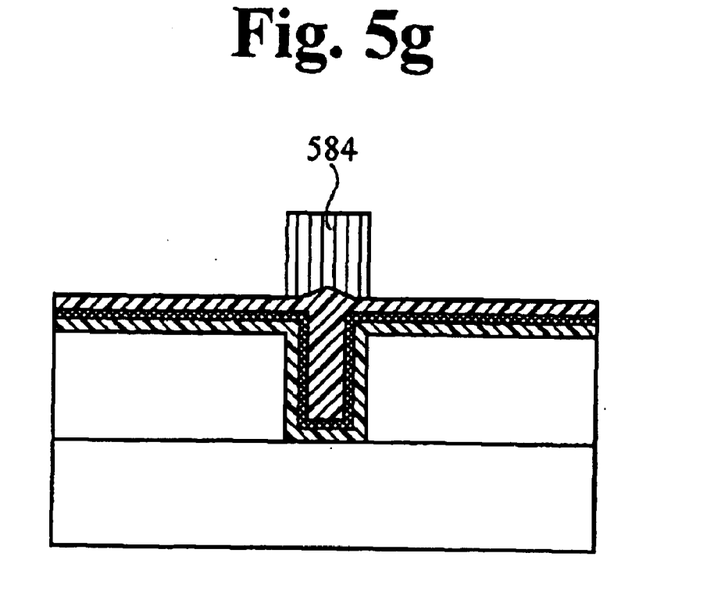
FIG. 5g is a cross-sectional drawing of FIG. 5a showing photo-resist layer on top.
Figure 5H:
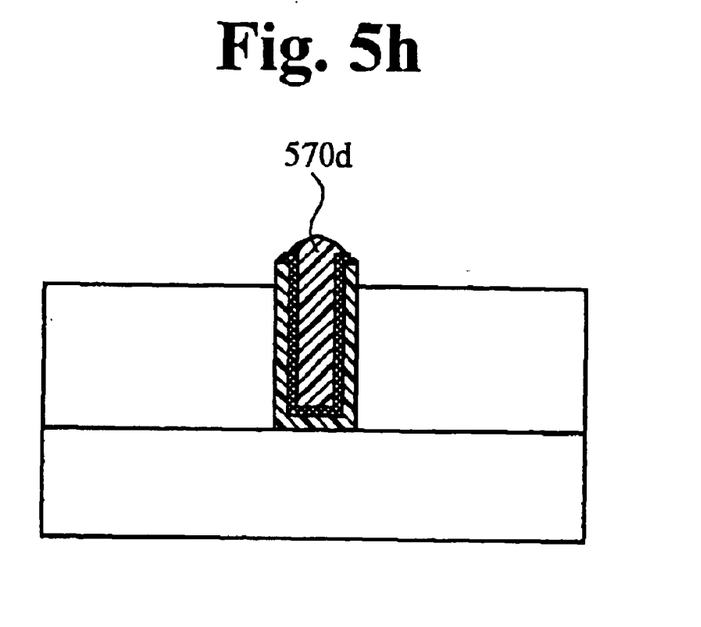
FIG. 5h is a cross-sectional drawing of FIG. 5g with the top copper layer and a selective photo-resist removed by etching.

This is yet another exemplary method of eliminating and planarizing the top conductive layers 530, 540 and 554 in FIG. 5a by means of selective etching according to the present invention. Referring to FIG. 5g, a photo-resist barrier layer 584 is formed as needed. Then, the remaining area is etched out, resulting in a "protruding" conductor 570d as well as a flat top surface without conducting materials left on the surface as shown in FIG. 5h according to the present invention. This is possible because the conductive layers 530, 540 and 554 in FIG. 5a are formed very thin according to the present invention. This "protruding" conductor 570d can be used as a pad or an input/output(I/O) terminal, as an example.

In the preferred embodiments described above, some of the exemplary methods and structures in realizing the present invention are disclosed and presented herein. Those who are knowledgeable in the art should be able to easily derive other methods and structures within the spirit of the present invention. Therefore, the scope of the methods and structures in accordance with the present invention is not limited to the preferred embodiments presented and described here.

What is claimed is:

1. A method of forming interconnecting conductors, the method comprising:

forming openings in one or more insulating layers on a silicon substrate;

forming a barrier layer on said one or more insulating layers including the openings formed therein;

forming a copper seed layer on said barrier layer using a copper source material by a chemical vapor deposition (CVD) method with a catalyst; and forming a copper layer on said copper seed layer by electroplating method using said copper seed layer as an electrode.

2. The method of claim 1, wherein said openings comprise trenches, via holes, cavities, contacts, or combinations thereof.

3. The method of claim 1, wherein said openings comprises a single-damascene structure, a dual-damascene structure, or both.

4. The method of claim 1, wherein said barrier layer comprises Ta, Ti, TaN, Ta—Si—N, or Ti—Si—N.

5. The method of claim 1, wherein said catalyst comprises iodine, bromine, or both.

6. The method of claim 1, wherein said copper source material for forming said copper seed layer by using said CVD with a catalyst is (hfac)Cu(vtms).

7. A method of forming interconnecting conductors, the method comprising:

forming openings in one or more insulating layers on a semiconductor substrate;

forming a barrier layer overlying said one or more insulating layers having the openings formed therein;

forming a copper seed layer overlying said barrier layer using a copper source material by a chemical vapor deposition (CVD) method with a catalyst comprising iodine, bromine, or both; and forming a copper layer overlying said copper seed layer by electroplating using said copper seed layer as an electrode.

8. The method of claim 7, wherein said barrier layer comprises Ta, Ti, TaN, TiN, Ta—Si—N, or Ti—Si—N.

9. The method of claim 7, wherein said copper source material for forming said copper seed layer by using said CVD method with a catalyst is (hfac)Cu(vtms).

10. A method of forming interconnecting conductors, the method comprising:

forming openings in one or more insulating layers on a semiconductor substrate;

forming a barrier layer on said one or more insulating layers including the openings formed therein;

applying a catalyst on said barrier layer;

thereafter, forming a copper seed layer on said barrier layer using a copper source material by a chemical vapor deposition (CVD) method; and forming a copper layer on said copper seed layer by electroplating method using said copper seed layer as an electrode.

11. The method of claim 10, wherein said catalyst comprises iodine, bromine, or both.

12. The method of claim 10, wherein said applying a catalyst and said forming a copper seed layer are repeated at least twice in sequence.

* * * * *

UNITED STATES PATENT AND TRADEMARK OFFICE
CERTIFICATE OF CORRECTION

PATENT NO. : 6,720,262 B2
DATED : April 13, 2004
INVENTOR(S) : Koh et al.

It is certified that error appears in the above-identified patent and that said Letters Patent is hereby corrected as shown below:

Column 2,
Line 17, "the comers reasonably" should read -- the corners reasonably --.

Column 5,
Line 6, "the comers at" should read -- the corners at --.

Column 10,
Line 11, "TaN, Ta-Si-N, or" should read -- TaN, TiN, Ta-Si-N, or --.

Signed and Sealed this

First Day of February, 2005

JON W. DUDAS
*Director of the United States Patent and Trademark Office*